United States Patent [19]

Markovich et al.

[11] Patent Number: 5,055,342
[45] Date of Patent: Oct. 8, 1991

[54] FLUORINATED POLYMERIC COMPOSITION, FABRICATION THEREOF AND USE THEREOF

[75] Inventors: Voya Markovich, Endwell; Ashit Mehta, Vestal; Jae M. Park, Somers; Eugene Skarvinko, Binghamton; David W. Wang, Vestal, all of N.Y.

[73] Assignee: International Business Machines Corporation, Armonk, N.Y.

[21] Appl. No.: 484,173

[22] Filed: Feb. 16, 1990

[51] Int. Cl.$^5$ .............................................. B32B 3/00
[52] U.S. Cl. .................................... 428/137; 428/209; 428/323; 428/421; 428/422; 428/901; 361/397; 361/398; 427/96; 525/235; 525/935; 525/936
[58] Field of Search ............... 428/137, 209, 421, 422, 428/901, 323; 361/397, 398; 427/96; 525/235, 935, 936

[56] References Cited

U.S. PATENT DOCUMENTS

| | | | |
|---|---|---|---|
| 3,787,281 | 1/1974 | Effenberger | 161/188 |
| 4,134,848 | 1/1979 | Adicoff et al. | 252/63.2 |
| 4,238,641 | 12/1980 | Planting et al. | 174/88 C |
| 4,241,132 | 12/1980 | Pratt et al. | 428/285 |
| 4,268,337 | 5/1981 | Ibata et al. | 156/244 |
| 4,335,180 | 6/1982 | Traut | 428/303 |
| 4,405,543 | 9/1983 | Murphy et al. | 264/123 |
| 4,431,698 | 2/1984 | Case et al. | 428/244 |
| 4,447,565 | 5/1984 | Lula et al. | 523/219 |
| 4,610,495 | 9/1986 | Landi | 339/75 |
| 4,634,631 | 1/1987 | Gazit et al. | 428/421 |
| 4,640,866 | 2/1987 | Suzuki | 428/422 |
| 4,661,301 | 4/1987 | Okada et al. | 264/41 |
| 4,680,220 | 7/1987 | Johnson | 428/241 |
| 4,788,230 | 11/1988 | Mudge | 523/219 |
| 4,818,619 | 4/1989 | Strepparola et al. | 428/421 |
| 4,849,284 | 7/1989 | Arthur et al. | 428/421 |
| 4,886,699 | 12/1989 | Carroll et al. | 428/422 |

FOREIGN PATENT DOCUMENTS

| | | |
|---|---|---|
| 279769 | 8/1988 | European Pat. Off. . |
| 2162124 | 1/1986 | United Kingdom . |
| 2195269 | 4/1986 | United Kingdom . |

OTHER PUBLICATIONS

Haining et al., "Low Dielectric Constant Material for Printed Circuit Boards", IBM Technical Disclosure Bulletin, vol. 22, No. 5, Oct. 1979.

Katz et al., "Handbook of Fillers for Plastics," Chapter 21, Solid Spherical Fillers, pp. 429–452, Van Nostrand Reinhold Company.

Chandrashekhar et al., "Fabrication of Printed Circuit Wiring Boards Using Insulation Layers with Low Dielectric Constant," IBM Technical Disclosure Bulletin, vol. 31, No. 7, Dec. 1983, pp. 25–26.

*Primary Examiner*—Patrick J. Ryan
*Attorney, Agent, or Firm*—Pollock, Vande Sande & Priddy

[57] ABSTRACT

Fluorinated polymeric composition exhibiting low dielectric constant and a low coefficient of thermal expansion containing a fluorinated polymeric material and a silica and/or quartz filler having a mean particle size of no greater than 7 microns, and use thereof to form a substrate having vias therein. Layers of the above composition are obtained by applying the composition to a substrate and then heating the composition to a temperature sufficient to cause the composition to fuse.

28 Claims, No Drawings

FLUORINATED POLYMERIC COMPOSITION, FABRICATION THEREOF AND USE THEREOF

TECHNICAL FIELD

The present invention is concerned with compositions exhibiting a low dielectric constant and a low coefficient of thermal expansion and especially to compositions containing fluorinated polymeric material as the binder. In addition, the present invention is concerned with methods for fabricating layers of the composition that are suitable for substrates for printed circuit boards and cards. The compositions of the present invention are especially suitable for providing substrates that contain vias therein obtained by laser drilling, and/or mechanical drilling and/or punching.

BACKGROUND ART

In the manufacture of printed circuit boards and cards, a dielectric sheet material is employed as the substrate. A conductive circuit pattern is provided on one or both of the major surfaces of the substrate.

As described in, for instance, U.S. Pat. No. 3,689,991 and Tummala et al, "Micro Electronics Packaging Handbook", pages 409-435, Van Nostrand Reinhold, flexible polymeric films can be used as carriers in the packaging of semiconductor chips such as in the so-called TAB (Tape Automated Bonding) procedure. To date, the primary polymeric material employed for such has been polyimides. One procedure used for employing polyimide as the dielectric and/or circuit carrier for flexible circuits involves spray coating or roller coating polyamic acid onto a sheet of metal (such as stainless steel or aluminum). The film is then cured or imidized, resulting in a film which is fully or substantially fully cured. The metal which the polyimide is on can be imaged, removed or maintained. On top of the polyimide, three layers of metal are generally deposited such as by either evaporation or sputtering. The metal conductors are chromium or nickel, followed by a layer of copper, followed by a layer of chromium or nickel. By means of photolithographic operations, this metal is imaged into circuits. Depending on the use of the circuit, the cured polyimide may or may not be imaged either before or after the formation of the circuit.

In addition, flexible circuits have also been fabricated using free-standing polymeric films such as polyimides onto which metal layers are vacuum-deposited, laminated or glued. The metal circuit pattern is defined by using a photoresist pattern to either act as a plating mask or act as a mask for subtractive etching of the metal layer. Via holes of the polymer film can be made by drilling, punching or etching.

In addition, the selective formation of holes in insulating polymeric films to provide openings or vias therein is important for various electronic uses of dielectric polymeric films. For instance, in the packaging of semiconductor chips, polymers such as polyamic acid films have often be coated onto substrates and then cured either chemically or thermally.

In a number of these situations it is necessary to form vias into the polymeric layer to allow for electrical connections to be made between the different layers of metallurgy. In order that the interconnection be as accurate as possible, it is necessary that the polymeric films resist distortion of the desired pattern and withstand attack from other wet processing chemicals.

For instance, in the formation of multi-layer substrates for mounting chips, it is necessary to electrically connect some of the conductors in the upper or second layer of metalization to some of the conductors on the lower or first layer of metalization. In order to do so, the polymeric material must have vias formed therein to allow for metal connection between the upper and lower levels of metallization in connection to a chip and/or board.

Fluorinated polymeric materials such as polytetrafluoroethylene and polytrifluoromonochloroethylene are attractive candidates for advanced electronic packaging applications because of their very low dielectric constants, excellent stability, low solvent/moisture absorption and excellent thermal stability. However, the fluorinated polymeric materials have very poor coefficient of thermal expansion and therefore must include modifiers therein to achieve a coefficient of thermal expansion suitable for use as a substrate for electronic devices.

It has been suggested to provide compositions of polytetrafluoroethylene materials with certain fillers such as glass or ceramic microparticles to achieve improved dimensional stability and low thermal expansion coefficient (CTE) without a concomitant loss in the low dielectric properties in the polymeric material. In addition, for the most part these composites also include glass fibers therein. Along these lines, see U.S. Pat. Nos. 4,335,180 and 4,849,284.

However, the compositions suggested in the prior art require an amount of filler in excess of the polymeric material and/or the presence of fibers in addition to the relatively small particle size fillers. The fillers employed have mean particle diameters of 10-15 microns and films formed therefrom are a minimum of 1.5 mils thick.

The composites suggested in the prior art are not entirely satisfactory since difficulties are encountered in fabricating vias therein and laser drilling cannot be employed readily because of the relatively large size of the particles. Moreover, when glass fibers are present such tend to remain in the through holes.

Furthermore, the prior art suggestions result in compositions prior to film formation that are relatively doughy in consistency and therefore quite difficult to work with.

SUMMARY OF INVENTION

The present invention provides a composition that exhibits a low dielectric constant along with a low coefficient of thermal expansion and which is relatively easy to process as compared to the prior art suggestions. Moreover, the compositions of the present invention can be formed into films or layers having thicknesses of as low as about 0.5 mils. In addition, films pursuant to the present invention can be subjected to laser drilling, and/or mechanical drilling and/or punching.

In particular, the compositions of the present invention contain a fluorinated polymeric material and a filler whereby the filler has a mean particle size of no greater than about 7 microns. In addition, the filler is silica and/or quartz. The amount of the fluorinated polymer is about 50 to about 90% by weight and the amount of the filler is about 50 to about 10% by weight. These amounts are based upon the total of the fluorinated polymeric material and filler in the composition.

The present invention is also concerned with a method for fabricating a layer containing the fluorinated polymeric material. In particular, the process of the present invention includes obtaining the composition containing the fluorinated polymeric material and filler disclosed above and then applying the composition to a substrate. The composition is heated to a temperature of about 350° C. to about 400° C. to thereby fuse the composition.

Another aspect of the present invention is concerned with a circuitized substrate that contains a substrate exhibiting a low dielectric constant and low coefficient of thermal expansion and containing a fluorinated polymeric material and filler as disclosed above and having a metallic layer disposed on at least a portion of at least one of the major surfaces of the substrate.

BEST AND VARIOUS MODES FOR CARRYING OUT INVENTION

The fluorinated polymeric materials employed pursuant to the present invention are well-known and include such commercially available polyfluoroalkylene materials as polytetrafluoroethylene, copolymers of tetrafluoroethylene and hexafluoropropylene, copolymers of tetrafluoroethylene and perfluoro-2-2-dimethyl-1,3 dioxide, polytrifluorochloroethylene, copolymers of tetrafluoroethylene with for example olefins such as ethylene; copolymers of trifluoromonochloroethylene with for example olefins such as ethylene, polymers of perfluoroalkyl vinyl ether.

Some commercially available fluorinated polymeric materials employed pursuant to the present invention include those available under the trade designation TEFLON PTFE (polymers of tetrafluoroethylene), TEFLON FEP (perfluorinated ethylene-propylene copolymers); TEFLON PFA (copolymer of tetrafluoroethylene and perfluoroalkoxy); TEFZEL (copolymer of tetrafluoroethylene and ethylene); HALAR (copolymer of chlorotrifluoroethylene and ethylene); KEL-F (polymer of chlorotrifluoroethylene); HBF-430 (polymer of chlorotrifluoroethylene) and TEFLON AF (copolymer of tetrafluoroethylene and at least 65 mole % of perfluoro-2,2-dimethyl-1,3 dioxide). The preferred fluorinated polymeric material is polytetrafluoroethylene (e.g. TEFLON).

The compositions of the present invention further include a silica and/or quartz filler, which can be either in solid particles or in hollow microsphere form. The fillers employed pursuant to the present invention must exhibit a mean particle size of about 7 microns or less. According to preferred aspects of the present invention, the particle size distribution is about 0.1 to about 40 microns and most preferably about 2 to about 5 microns. The particle size is preferably no smaller than about 0.1 microns.

In addition, if desired, the fillers can be coated with a silane in amounts of about 0.2 to about 2.0%, typically about 1% by weight of the filler in order to render such more hydrophyllic. Typical silanes include p-chloromethylphenyltrimethoxy silane, aminoethylaminotrimethoxy silane, aminoethylaminopropyltrimethoxy silane. The compositions of the present invention must be free from fibrous fillers.

Commercially available fillers that can be employed pursuant to the present invention include L207 Novacup available from Malvern Mineral Co. (a crystalline silica surface treated and having an average particle size of 3.45 microns), Aerosil 200 (a fumed silica obtainable from Degussa Corporation and having an average particle size of 12 nanometers or a surface area of about 175 to about 225 square meters per·gram and having a $SiO_2$ content greater than 99.8%) and SDT-60 hollow microspheres obtainable from Grace Syntactic and having an average particle size of 7 μm. Other suitable fillers include MIN-U-SIL from U.S. Silica Co. having an average particle size of about 1.1 microns, and synthetic silica ($SiO_2$ 99.9%) from Cerac Corporation having an average particle size of about 2 microns and Quso G135 available from DeGussa and being a precipitated silica, having about 98% $SiO_2$, surface area of about 180 $m^2/g$, average agglomerate size of 2 microns. Certain of the fillers such as Quso G135 also act as antisettling agents.

It is crucial to the success of the present invention that the amount of polytetrafluoroethylene employed is equal to or greater than the amount of the filler and preferably the compositions contain about 50 to about 90% by weight and most preferably about 50 to about 70% by weight of the fluorinated polymeric material and correspondingly about 50 to about 10% by weight and preferably about 50 to about 30% by weight of the filler. These amounts are based upon the total of the filler and fluorinated polymeric material in the composition (dry bases).

If desired, the compositions of the present invention can include surface active agents such as non-ionic surfactants and antisettling agents. Such are normally employed in amounts of about 0.1 to about 10% by weight of the total composition and preferably about 0.5 to about 6% by weight. In fact, commercially available fluorinated polymer preparations include a surfactant.

In addition, according to preferred aspects of the present invention, during processing, the pH of the composition should be about 8 to about 11, and most preferably about 9 to about 9.5 in order to facilitate the processing. The pH can be controlled by adding a suitable base such as ammonium hydroxide.

The compositions of the present invention can be prepared by admixing an aqueous dispersion of the fluorinated polymeric material with a previously prepared filler dispersion under high speed agitation such as a high speed disperser at about 3000 to about 5000 RPM for about 10 to about 15 minutes. When a filler dispersion is prepared just prior to use relatively low speed agitation of about 100 RPM can be employed. The filler dispersion in turn should then be obtained under high speed agitation such as a high speed dispersion at about 3000 to about 5000 RPM for about 10 to about 15 minutes. The high speed disperser disperses the silica and/or quartz filler and deagglomerates the particles.

The composition is then coated onto a suitable substrate. This can be done as single sheets on a substrate or a continuous coating on a web type substrate. The coating is to the desired thickness of about 0.2 mils or higher and normally about 0.2 to about 4 mils, and preferably about 0.5 to about 3 mils thick.

After the coating of the composition onto a substrate to the desired thickness, the coating is baked to volatize surfactant when present at a temperature of about 260° to about 320° C. and preferably about 300° to about 320° C. Then the layer is fused at a temperature of about 350° to about 400° C. and preferably at about 380° to about 390° C. Prior to the removal of surfactant, if desired, the water from the composition can be removed by heating at about 100° C. for about 1 to about 30 minutes. The heating to remove surfactant is from about 0.25 hour to about 2 hours and preferably about 1 hour. The heating to cause the fusion or densification of the composition is usually for about 30 to about 120 minutes and generally carried out under pressure such as about 1000 to about 2000 PSI and preferably about 1700 to about 2000 PSI.

At this point, the substrate if desired can be removed such as by etching to provide a free-standing film of the fluorinated polymeric material and filler. Typical substrates employed in the process include copper and copper/InVar/copper composites. Such substrates are usually about 0.7 to about 40 mils thick and preferably about 0.7 to about 3 mils thick. When copper or copper composites are employed, such can be removed from the fluorinated polymeric composite by etching in a typical copper etchant such as cupric chloride.

With respect to those compositions that employ a surfactant and a pH adjustor, prior to the fusing and densification step, and after the water is removed, the composition is heated to a temperature of about 260° to about 320° C., typical of which is about 300° C. for about 0.25 to about 2 hours, typical of which is about 1 hour in order to remove the surfactant and the pH adjustor. Suitable surface active agents that can be employed include non-ionic surface active agents. A preferred surface active agent is octylphenoxyethanol commercially available under the trade designation Triton X-100 from Rohm and Haas.

In addition, the compositions should be free from flocculating agents such as those required in U.S. Pat. No. 4,849,284.

The compositions prepared pursuant to the present invention can be subjected to drilling or punching including laser drilling to provide desired vias in the substrate. The laser drilling is carried out with the coating facing the laser and employing various lasers with wavelengths from UV to IR region with 308 nanometers being preferred and a fluence between about 4 to about 20 joules/cm$^2$ (at 308 nm), typically about 8 joules/cm$^2$ employing a noble gas-halide laser such as xenon chloride. The laser drilling can either be the contact or projection type. In order to provide vias in predetermined areas, a laser resistant coating such as copper or copper/Invar/copper can be provided on the substrate over those areas where holes are not to be provided.

The vias produced by punching or drilling in the materials of the present invention are free from fibrous materials and are of extremely good quality.

The following examples are presented to further illustrate the present invention.

EXAMPLE 1

In a high speed disperser at about 3000 RPM are dispersed in about 10 to about 15 minutes, about 40 parts by weight of deionized water, about 46 parts by weight of crystalline silica (L337 Novacup available from Malvern Mineral Co. having a mean particle size of 3.45 microns) about 12.45 parts by weight of Aersol 200 available from Degussa Corporation, about 0.5 parts by weight of Quso G35 available from Degussa Corporation, about 0.5 parts by weight of Triton X-100 available from Rohm and Haas, and about 0.5 parts by weight of a 20% solution of ammonium hydroxide. To this dispersion are added about 100 parts by weight of 60% solids dispersion of polytetrafluoroethylene (TEFLON 30). The composition is mixed under low agitation for about 100 RPM for another 5 minutes.

The above composition is then coated onto a copper substrate to a thickness of about 1.3. The water is then removed by heating for about 30 minutes at about 100° C. and then the surfactant and NH$_4$OH are removed by heating for about 2 hours at about 300° C. The composition is then fused by heating at about 350° to about 380° C. under a pressure of about 1700 PSI.

The copper is removed by etching in a cupric chloride etching bath to provide a free-standing film.

The film exhibits uniform dispersion and fusing of the silica particles in the polytetrafluoroethylene matrix. The dry composite after fusing has a CTE of about 30 PPM/°C. in the X and Y directions and about 36 PPM/°C. in the Z direction.

EXAMPLE 2

A composition containing about 420 grams of a polytetrafluoroethylene aqueous dispersion TEFLON 30, 60% solid is mixed with silica dispersion of about 225 grams of silica having an average particle size of 3.65 microns available from Malvern Mineral Co. under the trade designation NOVACITE under high agitation in a high speed disperser at about 3000 to about 5000 RPM for about 10 to 15 minutes.

The composition is then coated from the aqueous dispersion onto a copper substrate to a thickness of about 1.3 mils thick. The coating is then heated to remove water at a temperature of about 100° C. to about 110° C. followed by heating 1 hour at 300° C. to volatilize surfactant and pressed under a pressure of about 1700 PSI for about 65 minutes at about 350° C. to about 400° C. The thickness of the film is about 0.5–1 mils thick.

The copper is removed by etching in cupric chloride. The free standing film is free from pin holes with the results similar to those of Example 1.

EXAMPLE 3

Example 2 is repeated except that about 252 grams of quartz available from Denimex Corp. having a mean particle size of about 5 microns is employed in place of the silica. The results obtained were similar to those of Example 1.

EXAMPLE 4

In a high speed disperser at about 3000 RPM are dispersed in about 10 to about 15 minutes, about 18 parts by weight of deionized water, about 25 parts by weight of amorphous silica (available from CERAC Co. having an average particle size of 2 microns), about 0.75 parts by weight of hollow microspheres average size 7 microns available from Grace Syntactics, about 0.2 parts by weight of A1100 silane. To this dispersion are added about 52 parts by weight of 60% dispersion of polytetrafluoroethylene (TEFLON 30). The composition is mixed under low agitation for about 100 RPM for another 5 minutes.

The above composition is then coated on a copper substrate to a thickness of about 2 ml. The water is then removed by heating for about 30 minutes at about 100° C. followed by heating 1 hour at about 300° C. to remove surfactant. The composition is then fused or densified by heating at about 380° to about 390° C. under pressure of about 1700 PSI.

The copper is removed by etching in a cupric chloride etching bath to provide a free-standing film.

The film exhibits uniform dispersion and fusing of the silica particles in the polytetrafluoroethylene matrix. The dielectric constant of the resultant film is about 2.7.

EXAMPLE 5

Two (2) g of Grace SDT-60 hollow microspheres are dispersed in about 10% solution of TEFLON AF 1600 resin in Fluoroinert FC-77 solvent (obtainable from 3M) at 100-500 RPM for about 10-15 minutes. This composition is then coated on a copper substrate to a thickness of about 1-2 mils. The solvent is then removed by heating for about 30-60 minutes at about 110° C. The composition is laminated at about 240°-280° C. under a pressure of about 1000 PSI. The copper is removed by etching in cupric chloride to provide a free standing film. The dielectric constant of the film was less than 1.9.

We claim:

1. A circuitized substrate free from fibrous fillers and containing
   I. a substrate exhibiting a low dielectric constant and a low coefficient of thermal expansion, which contains:
   A. fluorinated polymeric material; and
   B. a filler having a mean particle size of no greater than about 7 μm and being selected from the group of silica, quartz, hollow microspheres and mixtures thereof; and wherein the amount of A is about 50 to 90 weight percent, and the amount of B is about 50 to about 10 weight percent; based upon the total of A and B in the substrate; and
   II. metallic layer being disposed on at least a portion of at least one of the major surfaces of said substrate.

2. The substrate of claim 1 being at least about 0.5 mils thick.

3. The substrate of claim 1 having vias therein.

4. The substrate of claim 1 having laser drilled vias therein.

5. The substrate of claim 1 wherein the fluorinated polymeric material is selected from the group of polymers of tetrafluoroethylene, copolymers of tetrafluoroethylene and perfluoro-2,2-dimethyl-1,3-dioxide, copolymer of tetrafluoroethylene and hexafluoropropylene, copolymer of tetrafluoroethylene and perfluoroalkoxy, fluorinated ethylene-propylene copolymers and mixtures thereof.

6. The substrate of claim 1 having a dielectric constant of less than about 3.2

7. A composition free from fibrous fillers and possessing a low dielectric constant and a low coefficient of thermal expansion which comprises:
   A. fluorinated polymeric material; and
   B. a filler having a mean particle size of no greater than about 7 μm and being selected from the group of silica, quartz particles, hollow microspheres and mixtures thereof; and wherein the amount of A is about 50 to about 90 weight %, and the amount of B is about 50 to about 10 weight %, based upon the total of A and B in the composition.

8. The composition of claim 7 being in the form of a layer of at least about 0.5 mils.

9. The composition claim 7 having a dielectric constant of less than about 3.2.

10. The composition of claim 2 wherein said layer has laser drilled vias therein.

11. The composition of claim 7 wherein said fluorinated polymeric material is selected from the group of polymers of tetrafluoroethylene, copolymers of tetrafluoroethylene and perfluoro-2,2-dimethyl-1,3-dioxide, copolymer of tetrafluoroethylene and hexafluoropropylene, copolymer of tetrafluoroethylene and perfluoroalkoxy, fluorinated ethylene-propylene copolymers and mixtures thereof.

12. The composition of claim 1 being fee from flocculating agents.

13. The composition of claim 1 wherein said fluorinated polymer material is polytetrafluoroethylene.

14. The composition of claim 1 wherein the particle size distribution of the filler is about 0.1 to about 40 microns.

15. The composition of claim 1 wherein the particle size distribution of the filler is about 2 to about 5 microns.

16. The composition of claim 1 wherein said filler is coated with a silane in amount of about 0.2 to about 2% by weight of the filler.

17. The composition of claim 1 wherein the amount of filler is about 50 to about 30% by weight based upon the total of the filler and polymeric material.

18. The composition of claim 1 which further includes a surfactant or antisettling agent in an amount of about 0.1 to about 10% by weight of the composition.

19. A process for fabricating a layer free from fibrous fillers and containing fluorinated polymeric material wherein said layer possesses low dielectric constant and low coefficient of thermal expansion; which comprises:
   A. obtaining a composition containing a (1) fluorinated polymeric material; and (2) a filler having a mean particle size of no greater than about 7 μm and being selected from the group of silica, quartz particles, hollow microspheres and mixtures thereof; and wherein the amount of (1) is about 50 to about 90 weight percent; and the amount of (2) is about 50 to about 10 weight %, based upon the total of (1) and (2) in the composition;
   B. applying said composition to a substrate; and then
   C. heating the composition to a temperature of about 350° to about 400° C.

20. The process of claim 19 wherein said heating is carried out under pressure of about 1000-2000 psi.

21. The process of claim 19 which further includes forming vias in the layer by drilling or punching.

22. The process of claim 19 which further includes forming vias in the layer by laser drilling.

23. The process of claim 19 wherein said layer is at least about 0.5 mils thick.

24. The process of claim 19 which further includes prior to heating to fuse said composition, heating to remove water followed by heating to about 260° to about 320° C. for about 1 to 2 hours to remove surfactant present in the composition.

25. The process of claim 19 wherein the fluorinated polymeric material is selected from the group of polymers of tetrafluoroethylene, copolymers of tetrafluoroethylene and perfluoro-2,2-dimethyl-1,3-dioxide, copolymer of tetrafluoroethylene and hexafluoropropylene, copolymer of tetrafluoroethylene and perfluoroalkoxy, fluorinated ethylene-propylene copolymers and mixtures thereof.

26. The process of claim 19 wherein the dielectric constant of the layer is less than about 3.2.

27. The process of claim 6 wherein the pH of the composition during said process is about 8 to about 11.

28. The process of claim 27 wherein said pH is about 9 to about 9.5.

* * * * *